(12) United States Patent
Kobayashi

(10) Patent No.: US 12,375,045 B2
(45) Date of Patent: Jul. 29, 2025

(54) RECONFIGURABLE AMPLIFIER

(71) Applicant: Qorvo US, Inc., Greensboro, NC (US)

(72) Inventor: Kevin Wesley Kobayashi, Redondo Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 816 days.

(21) Appl. No.: 17/630,593

(22) PCT Filed: Jul. 29, 2020

(86) PCT No.: PCT/US2020/043931
§ 371 (c)(1),
(2) Date: Jan. 27, 2022

(87) PCT Pub. No.: WO2021/021843
PCT Pub. Date: Feb. 4, 2021

(65) Prior Publication Data
US 2022/0255512 A1 Aug. 11, 2022

Related U.S. Application Data

(60) Provisional application No. 62/881,267, filed on Jul. 31, 2019.

(51) Int. Cl.
*H03F 3/19* (2006.01)

(52) U.S. Cl.
CPC .......... *H03F 3/19* (2013.01); *H03F 2200/171* (2013.01); *H03F 2200/451* (2013.01)

(58) Field of Classification Search
CPC .......... H03F 3/19; H03F 2200/171; H03F 2200/451; H03F 2200/15; H03F 2200/18;
(Continued)

(56) References Cited

U.S. PATENT DOCUMENTS

2005/0176399 A1* 8/2005 Aparin ............... H03F 1/3205
455/341
2012/0077453 A1 3/2012 Ahrari et al.
(Continued)

OTHER PUBLICATIONS

Kobayashi, K.W., "Bias Optimized IP2 & IP3 Linearity and NF of a Decade-Bandwidth GaN MMIC Feedback Amplifier," 2012 IEEE Radio Frequency Integrated Circuits Symposium, Jun. 17-19, 2012, Montreal, QC, Canada, IEEE, 4 pages.
(Continued)

*Primary Examiner* — Andrea Lindgren Baltzell
*Assistant Examiner* — Khiem D Nguyen
(74) *Attorney, Agent, or Firm* — Withrow & Terranova, P.L.L.C.

(57) ABSTRACT

A reconfigurable amplifier configured to decrease radio frequency (RF) signal distortion and increase dynamic range is disclosed. The reconfigurable amplifier includes an amplifier having an RF signal input, an RF signal output, and a bias signal input. A distortion detection network has a detector input coupled to the RF signal output and a detector output, wherein the distortion detector network is configured to generate a detection signal that is proportional to distortion at the RF signal output. A bias controller has a detection signal input coupled to the detector output and a bias output coupled to the bias signal input. The bias controller is configured to generate a bias signal that dynamically shifts level at the bias output to reduce the distortion at the RF signal output in response to the detection signal.

21 Claims, 16 Drawing Sheets

(58) Field of Classification Search
CPC ......... H03F 2200/297; H03F 2200/301; H03F 2200/393; H03F 2200/435; H03F 2200/504; H03F 1/3205; H03F 1/342; H03F 1/56; H03F 1/0233; H03F 3/193; H03F 3/21; H03F 2200/144; H03F 2200/21; H03F 2200/222; H03F 2200/294; H03F 2200/387; H03F 2200/471; H03F 2200/75; H03F 1/223; H03F 1/0272
USPC ....................................................... 330/296
See application file for complete search history.

(56) References Cited

U.S. PATENT DOCUMENTS

| | | | |
|---|---|---|---|
| 2016/0105153 A1* | 4/2016 | Chen | H03F 1/0205 330/296 |
| 2018/0091099 A1 | 3/2018 | Kobayashi et al. | |
| 2019/0140598 A1 | 5/2019 | Schultz et al. | |
| 2019/0199291 A1 | 6/2019 | Choi et al. | |
| 2020/0337767 A1* | 10/2020 | Hancock | H03F 3/19 |

OTHER PUBLICATIONS

Invitation to Pay Additional Fees and Partial International Search for International Patent Application No. PCT/US2020/043931, mailed Oct. 16, 2020, 17 pages.
International Search Report and Written Opinion for International Patent Application No. PCT/US2020/043931, mailed Dec. 7, 2020, 21 pages.

* cited by examiner

RECONFIGURABLE AMPLIFIER

RELATED APPLICATIONS

This application is a 35 USC 371 national phase filing of International Application No. PCT/US2020/043931, filed Jul. 29, 2020, which application claims the benefit of provisional patent application Ser. No. 62/881,267, filed Jul. 31, 2019, the disclosures of which are hereby incorporated herein by reference in their entireties.

FIELD OF THE DISCLOSURE

The present disclosure generally relates to electronic amplifiers and in particular to radio frequency amplifiers that include measures to maintain a wide output dynamic range for radio frequency amplifiers.

BACKGROUND

An output dynamic range is a figure of merit for radio frequency amplifiers. Output dynamic range is a difference between a lowest usable output signal level and a highest usable output signal level. A lower limit of usable output signal level is typically dictated by output noise. An upper limit of usable output signal level is typically dictated by output signal distortion.

During operation, radio frequency amplifiers come under the influence of various challenging environments that may limit output dynamic range. Broadly, these various challenging environments manifest as signal distortion. Examples of challenging environments include but are not limited to internal and external interfering signals, antenna impedance changes, and changing ambient temperatures. Accordingly, in the face of these challenging environments there remains a need for reconfigurable amplifier configured to provide improved output dynamic range for radio frequency amplifiers.

SUMMARY

A reconfigurable amplifier configured to decrease radio frequency (RF) signal distortion and increase dynamic range is disclosed. The reconfigurable amplifier includes an amplifier having an RF signal input, an RF signal output, and a bias signal input. A distortion detection network has a detector input coupled to the RF signal output and a detector output, wherein the distortion detector network is configured to generate a detection signal that is proportional to distortion at the RF signal output. A bias controller has a detection signal input coupled to the detector output and a bias output coupled to the bias signal input. The bias controller is configured to generate bias signals that dynamically shift level at the bias output to reduce the distortion at the RF signal output in response to the detection signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
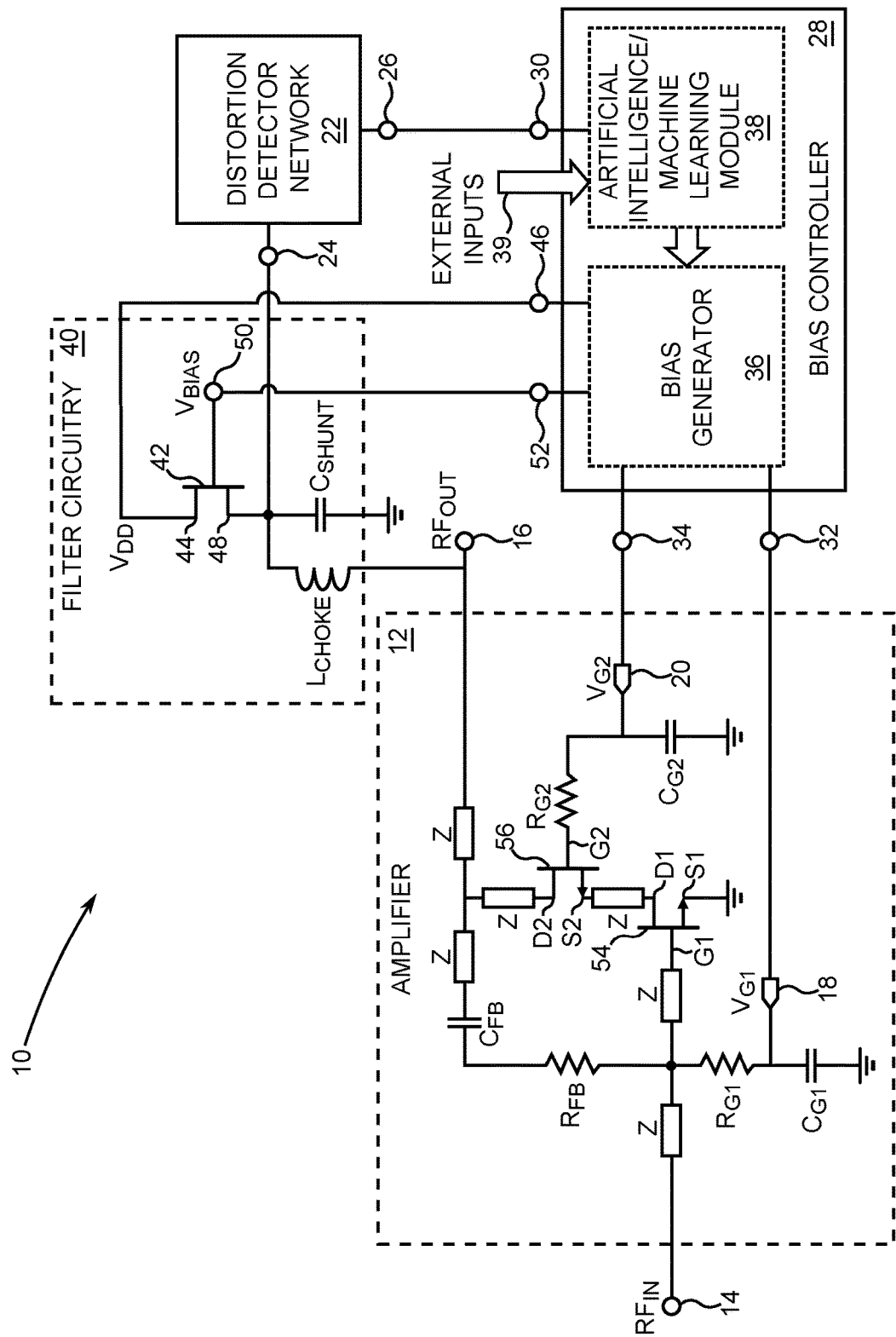
FIG. 1 is a schematic depicting an embodiment of reconfigurable amplifier of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 depicts an exemplary embodiment of reconfigurable amplifier 10 of the present disclosure. The reconfigurable amplifier 10 includes an amplifier 12 having a radio frequency (RF) input 14, an RF signal output 16, and at least one bias input such as a first bias input 18 and a second bias input 20 as depicted in FIG. 1. A distortion detector network 22 has a detector input 24 that is coupled to the RF signal output 16 and a detector output 26. The distortion detector network 22 is configured to generate a distortion detection signal that is proportional to distortion of an amplified RF signal at the RF signal output 16. In some exemplary embodiments, the distortion is baseband intermodulation distortion. The distortion detector network 22 is further configured to detect down-converted baseband odd order distortion. The distortion detector network 22 is also further configured to detect down-converted baseband even order distortion. In some exemplary embodiments, the distortion detection signal is baseband byproduct distortion of an RF intermodulation signal at the RF signal output 16.

A bias controller 28 has a detection signal input 30 coupled to the detector output 26 and at least one bias output such as a first bias output 32 coupled to the first bias input 18 and a second bias output 34 coupled to the second bias input 20. In the exemplary embodiment of reconfigurable amplifier 10 depicted in FIG. 1, a bias generator 36 is configured to generate a first bias signal at the first bias output 32 and a second bias signal at the second bias output 34 in response to the distortion detection signal generated by the distortion detector network 22. Moreover, in this particular exemplary embodiment, the bias controller 28 also includes an artificial intelligence/machine learning module 38 configured to fine tune control of the bias generator 36 using artificial intelligence techniques. The artificial intelligence techniques include but are not limited to machine learning methods such as multilayer perceptrons, backpropagation, stochastic gradient descent, convolutional neural networks, recurrent neural networks, and long short-term memory networks.

In this exemplary embodiment, the artificial intelligence/machine learning module 38 is configured to receive the distortion detection signal through the detection signal input 30 and environmental parameters through external inputs 39 to identify patterns and relations associated with the distortion detection signal and based upon the pattern and relations identified to more accurately and finely drive the bias generator 36 to generate bias signal levels that minimize distortion of the amplified RF signal at the RF signal output 16. A few exemplary environmental parameters may include but are not limited to power dissipation, antenna impedance, light, temperature, and process. The artificial intelligence/machine learning module 38 may be implemented, for example, in an embedded field-programmable gate array.

Filter circuitry 40 is coupled between the RF signal output 16 and the detector input 24. In this exemplary embodiment, the filter circuitry 40 is configured both to pass supply voltage $V_{DD}$ to the amplifier 12 and to pass a low-pass filtered version of the amplified RF signal spectrum to the distortion detector network 22 by way of the detector input 24. An inductor $L_{CHOKE}$ is coupled between the RF signal output 16 and the detector input 24. A shunt capacitor $C_{SHUNT}$ is coupled between the detector input 24 and a fixed voltage node such as ground.

In some embodiments, the inductance of the inductor $L_{CHOKE}$ and the capacitance of the shunt capacitor $C_{SHUNT}$ are sized to pass the low-pass filtered version of the amplified RF signal with components that are between 0 Hz and 200 MHz. In other embodiments, the inductance of the inductor $L_{CHOKE}$ and the capacitance of the shunt capacitor $C_{SHUNT}$ are sized to pass the low-pass filtered version of the amplified RF signal with components that are between 0 Hz and 100 MHz. In yet other embodiments, the inductance of the inductor $L_{CHOKE}$ and the capacitance of the shunt capacitor $C_{SHUNT}$ are sized to pass the low-pass filtered version of the amplified RF signal with components that are between 0 Hz and 50 MHz.

A supply transistor 42 has a first supply terminal 44 coupled to a third bias output 46 of the bias generator 36. The supply transistor 42 has a second supply terminal 48 coupled to the detector input 24. The supply transistor 42 further includes a supply control terminal 50 that is coupled to a fourth bias output 52 of the bias generator 36. The bias generator 36 is further configured generate a bias voltage $V_{BIAS}$ that is applied to the supply control terminal 50 to control a supply current that flows through the inductor $L_{CHOKE}$ to power the amplifier 12. The bias generator 36 may regulate the supply current by way of the supply transistor 42 in response to the distortion detection signal and thereby reduce the RF distortion of the RF signal at the RF signal output 16. In combination with regulation of the supply current by way of the supply transistor 42, or in an alternative, the bias generator itself may modulate the supply voltage $V_{DD}$ in response to the distortion detection signal and thereby reduce the RF distortion of the RF signal at the RF signal output 16. The supply transistor 42 may be a field-effect transistor (FET) or a resistor element having finite resistance. The supply transistor 42 may be replaced by a passive inductor-capacitor network that provides a finite alternating current impedance at baseband frequencies while passing direct current voltage and current.

In the exemplary embodiment of the reconfigurable amplifier 10, the amplifier 12 is of the single-ended type. In this case, the RF input 14 is coupled to a first gate G1 of a main FET 54 having a source S1 coupled to a fixed voltage node such as ground. The first bias input 18 is coupled to the first gate G1 through a first gate resistor $R_{G1}$. A first gate filter capacitor $C_{G1}$ is coupled between the first bias input 18 and a fixed voltage node such as ground. An optional common-gate FET 56 has a second source S2 that is coupled to a first drain D1 of the main FET 54. The benefits of the CS-CG cascode FET configuration are reduction of miller effect, mitigated thermal dissipation, and high output impedance conducive of broadband performance. A second gate G2 is coupled to the second bias input 20 through a second gate resistor $R_{G2}$. A second gate filter capacitor $C_{G2}$ is coupled between the second bias input 20 and a fixed voltage node such as ground. A second drain D2 is coupled to the RF signal output 16. A series combination of a feedback capacitor $C_{FB}$ and a feedback resistor $R_{FB}$ are coupled between the second drain D2 and the first gate G1 of the main FET 54. A plurality of impedance matching Z elements provide impedance matching throughout the amplifier 12.

Figure 2:
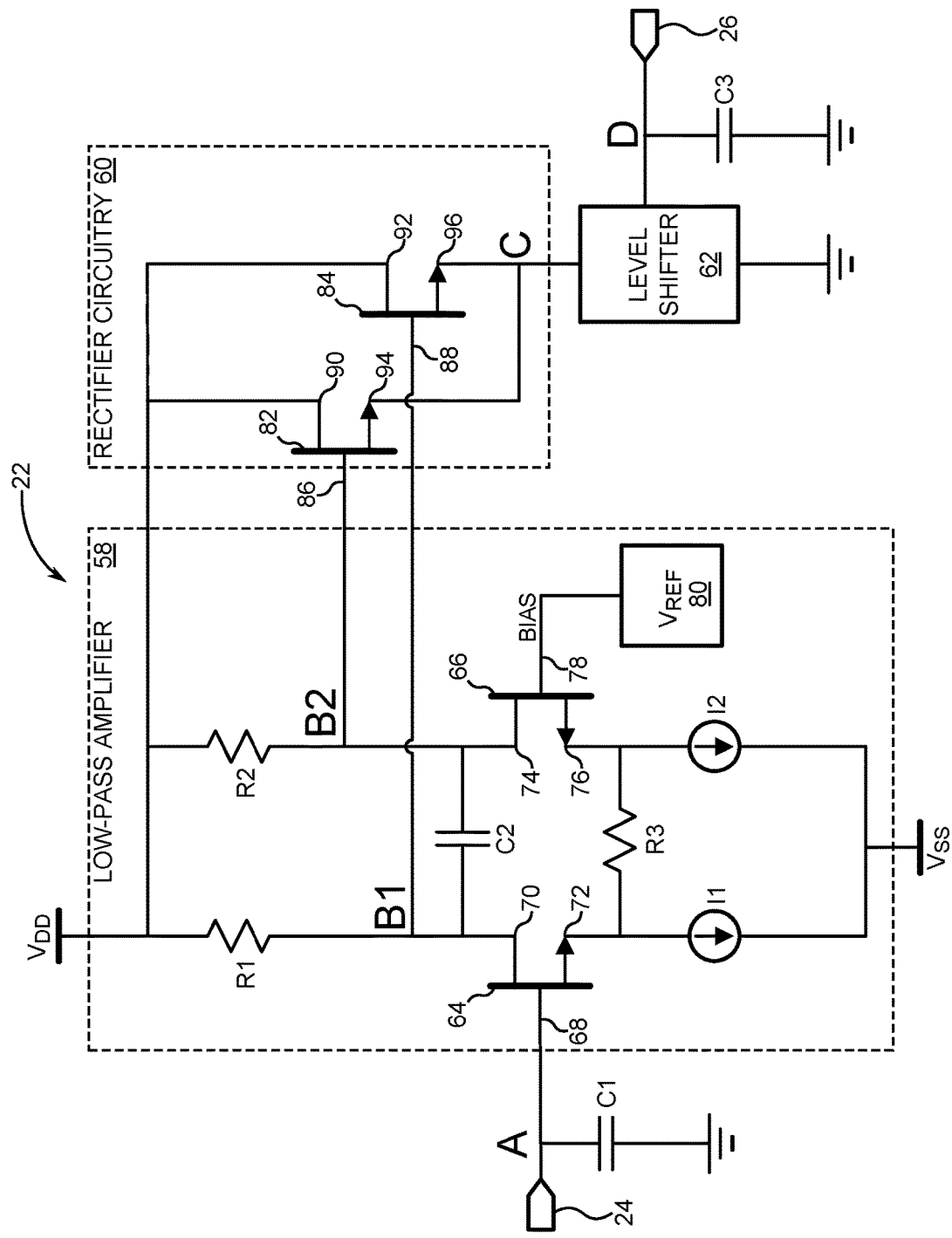
FIG. 2 is a schematic depicting an embodiment of a distortion detector network included in the reconfigurable amplifier of FIG. 1.

FIG. 2 depicts an exemplary embodiment of the distortion detector network 22 included in the reconfigurable amplifier 10 of FIG. 1. The distortion detector network 22 includes a low-pass amplifier 58, rectifier circuitry 60, and a level shifter 62. The low-pass amplifier 58 is a FET-based differential amplifier comprising a first differential FET 64 and a second differential FET 66. The first differential FET 64 has a first gate 68 that is coupled to the detector input 24, and an input filter capacitor C1 that is coupled between the first gate 68 and a fixed voltage node such as ground. A node labeled A in FIG. 2 couples detector input 24 to the first gate 68. The first differential FET 64 has a first drain 70 that is coupled to the supply voltage $V_{DD}$ through a first resistor R1. The first differential FET 64 also has a first source 72 that is coupled to a source voltage $V_{SS}$ through a first current source $I_1$.

The second differential FET 66 has a second drain 74 that is coupled to the supply voltage $V_{DD}$ through a second resistor R2. The second differential FET 66 also has a second source 76 that is coupled to the source voltage $V_{SS}$ through a second current source $I_2$. A second capacitor C2 is coupled between the first drain 70 and the second drain 74, and a second resistor R3 is coupled between the first source 72 and the second source 76. The second differential FET 66 has a second gate 78 that is coupled to a voltage reference 80 that provides a stable bias for the low-pass amplifier 58.

The rectifier circuitry 60 includes a first rectifier FET 82 and a second rectifier FET 84. The first rectifier FET 82 has a third gate 86 that is coupled to the second drain 74 of the second differential FET 66, and the second rectifier FET 84 has a fourth gate 88 coupled to the first drain 70 of the first differential FET 64. A node labeled B1 in FIG. 2 couples the first drain 70 to the fourth gate 88, and another node labeled B2 couples the second drain 74 to the third gate 86. The first rectifier FET 82 has a third drain 90, and the second rectifier FET 84 has a fourth drain 92, wherein the third drain 90 and the fourth drain 92 are both coupled to the supply voltage $V_{DD}$. The first rectifier FET 82 has a third source 94 that is coupled to a fourth source 96 of the second rectifier FET 84 at a node labeled C.

The level shifter 62 is coupled between the fourth source 96 and a fixed voltage node such as ground. The level shifter 62 receives a rectified signal from the rectifier circuitry 60 and provides a level shift to the rectified signal to generate the detection signal that is provided at the detector output 26. A third capacitor C3 coupled between the detector output 26 and a fixed node such as ground provides filtering of the detection signal at a node labeled D in FIG. 2. The distortion detector network 22 may be comprised of other embodiments that may employ a full-wave rectifier, or none at all, an average detector, or a peak detector, as determined by the specific application.

Figure 3:
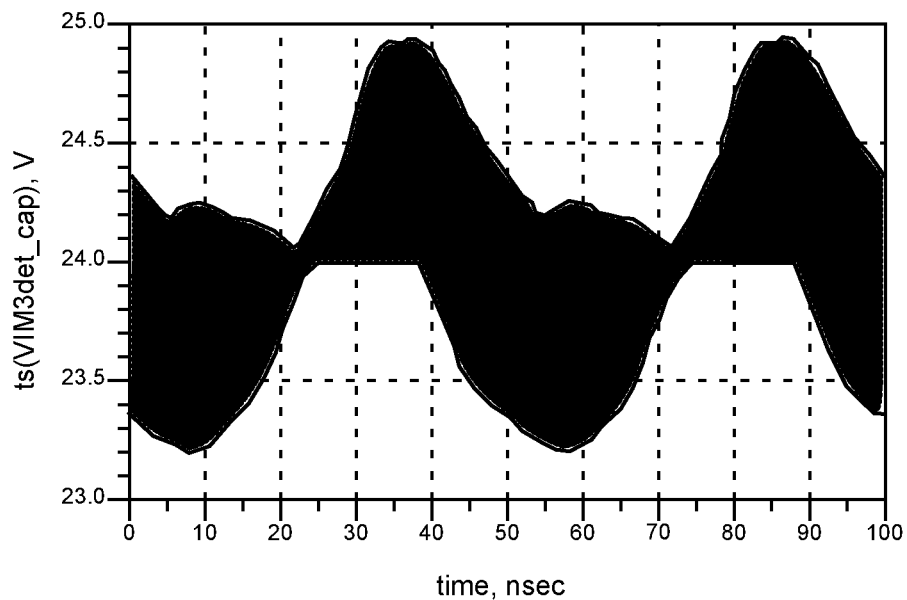
FIG. 3 is a graph depicting an envelope of an exemplary intermodulated beat or distortion byproduct signal at node A of the distortion detector network depicted in FIG. 2.
Figure 4:
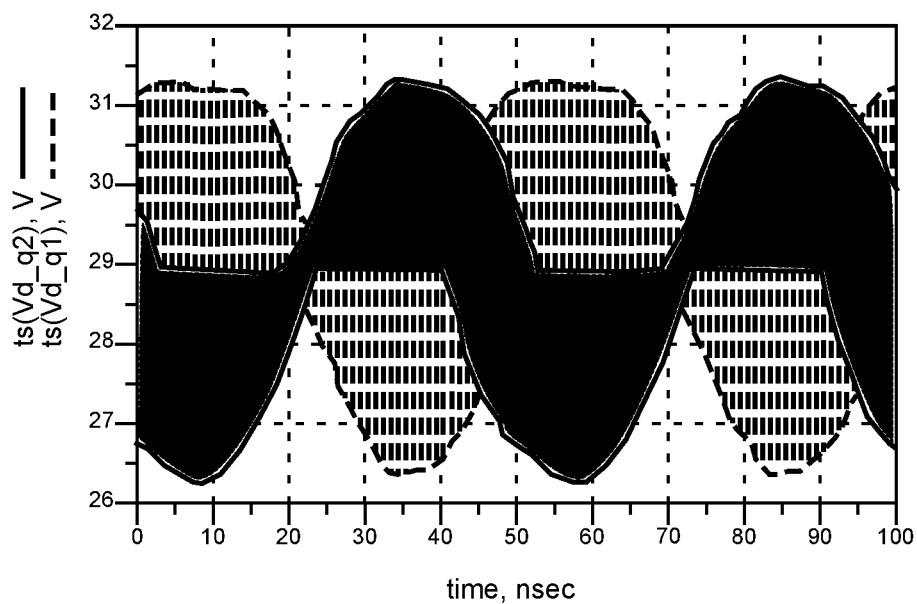
FIG. 4 is a graph depicting envelopes of amplified versions of the intermodulated beat or distortion byproduct signal at nodes B1 and B2 of the distortion detector network depicted in FIG. 2.
Figure 5:
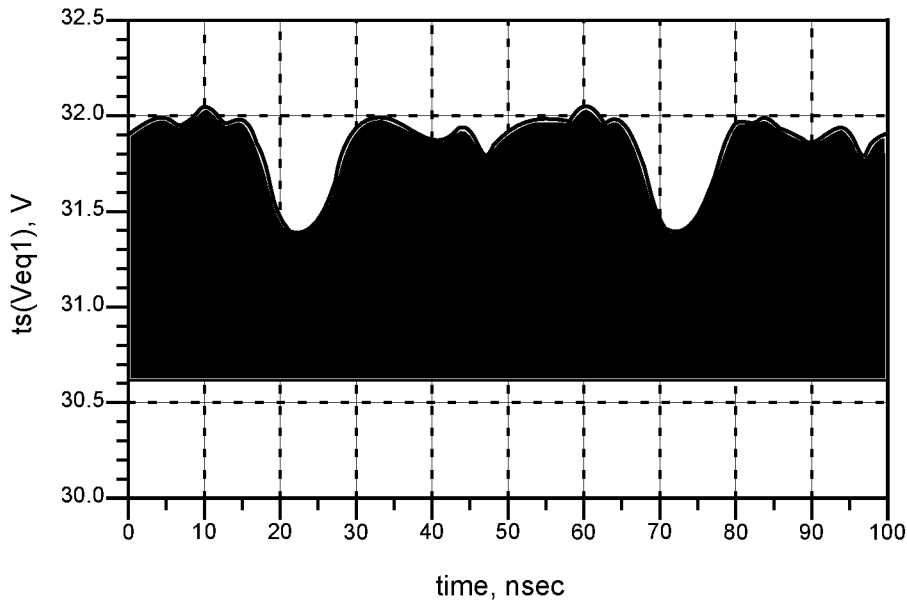
FIG. 5 is a graph depicting an envelope of a half-wave rectified version of combined amplified versions of the intermodulated beat or distortion byproduct signal at node C of the distortion detector network depicted in FIG. 2.
Figure 6:
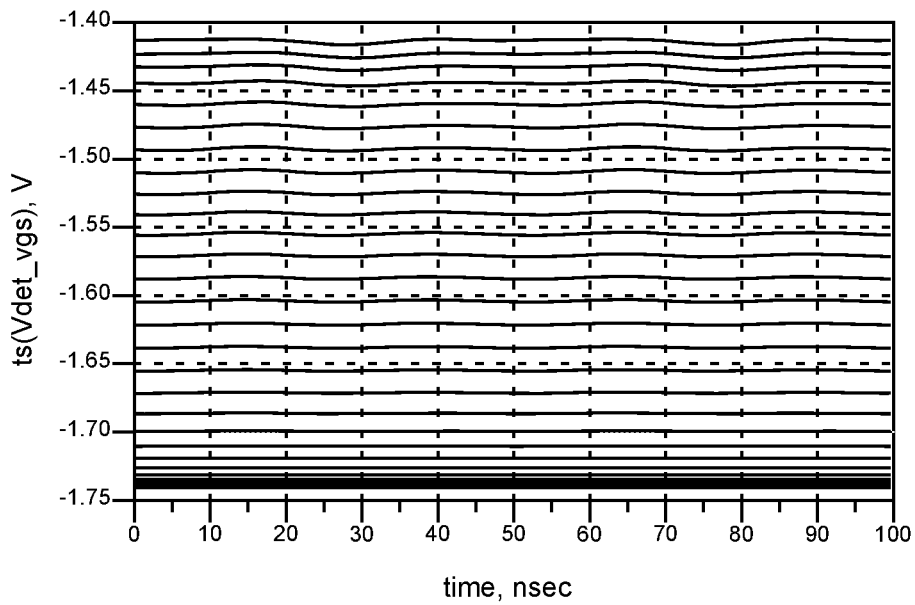
FIG. 6 is a graph depicting level shifted direct current detection that represents various distortion detection signals at node D of the distortion detector network depicted in FIG. 2.

FIG. 3 is a graph depicting an envelope of an exemplary low-pass filtered intermodulated beat signal at node A of the distortion detector network 22 depicted in FIG. 2. FIG. 4 is a graph depicting envelopes of amplified versions of the intermodulated beat signal at nodes B1 and B2 of the distortion detector network 22. FIG. 5 is a graph depicting an envelope of a half-wave rectified version of combined amplified versions of the intermodulated beat signal at node C of the distortion detector network 22. FIG. 6 is a graph depicting level shifted direct current detection that represents various distortion detection signals at node D of the distortion detector network 22.

Figure 7:
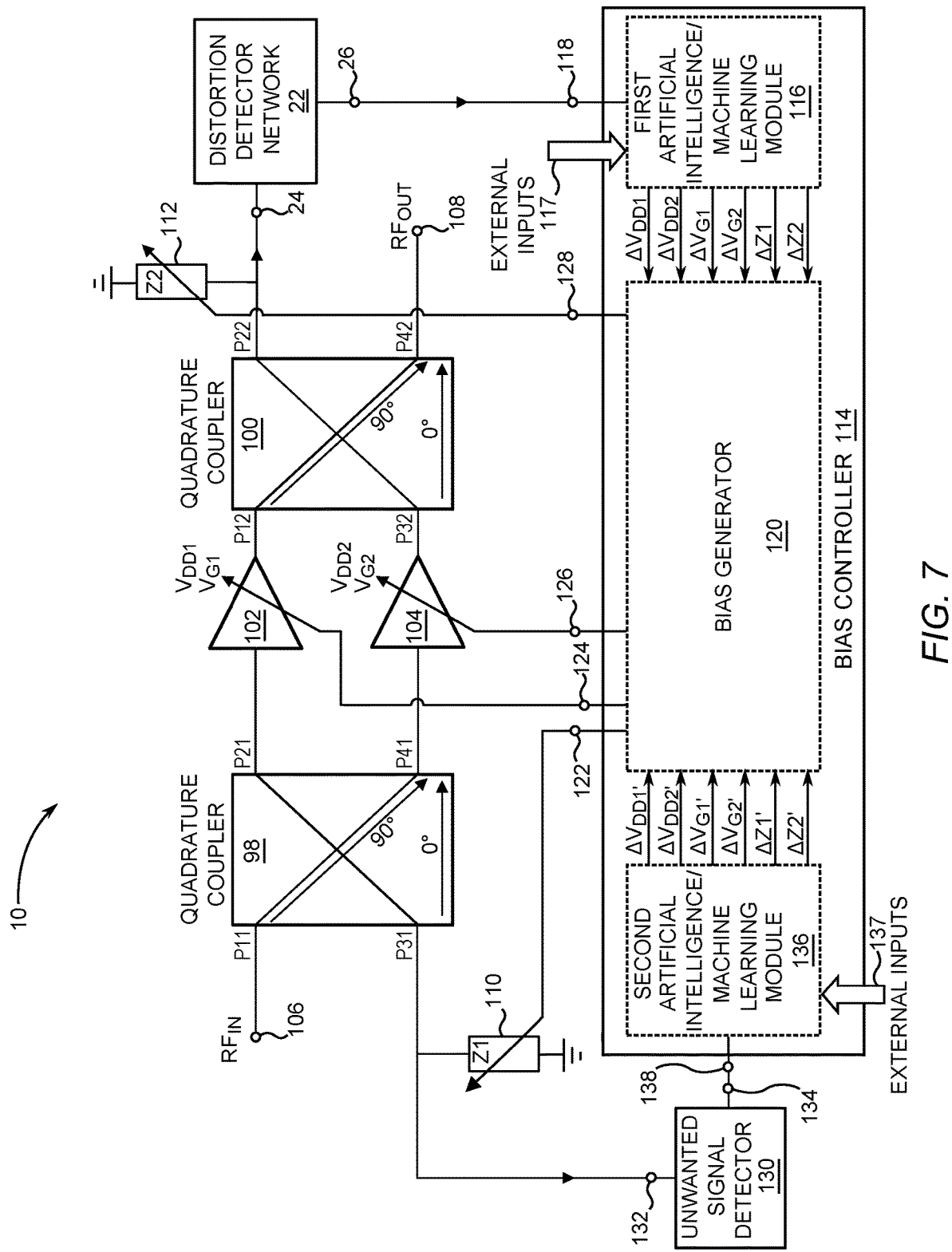
FIG. 7 is a schematic of a second embodiment of the reconfigurable amplifier that is structured and configured in accordance with the present disclosure.

FIG. 7 is a schematic of a second embodiment of the reconfigurable amplifier 10 that is structured and configured in accordance with the present disclosure. In exemplary embodiments, an input quadrature coupler 98 with ports labeled P11, P21, P31, and P41 and an output quadrature coupler 100 with ports labeled P12, P22, P32, and P42 are of the Lange coupler type. The input quadrature coupler 98 and the output quadrature coupler 100 both have microstrip or strip-line construction with geometric symmetry that ensures quadrature power combining of the output power of a first power amplifier 102 and a second power amplifier 104. In an alternative, the quadrature coupler may be constructed of equivalent lumped elements whose key characteristics provide similar operation and function for the present disclosure. The first power amplifier 102 and the second power amplifier 104 are coupled in parallel by way of the input quadrature coupler 98 at an input terminal 106 labeled $RF_{IN}$ and by way of the output quadrature coupler 100 at an output load terminal 108 labeled $RF_{OUT}$.

The input quadrature coupler 98 and the output quadrature coupler 100 both typically have less than 0.25 dB of insertion loss and an approximate octave frequency operating bandwidth. For example, in one embodiment, the input quadrature coupler 98 and the output quadrature coupler 100 may both be Lange couplers having a minimum frequency of 12 GHz and a maximum frequency of 24 GHz. In another embodiment, the input quadrature coupler 98 and the output quadrature coupler 100 may be both Lange couplers having a minimum frequency of 18 GHz and a maximum frequency of 36 GHz. In yet another embodiment, the input quadrature coupler 98 and the output quadrature coupler 100 may both be Lange couplers having a minimum frequency of 27 GHz and a maximum frequency of 54 GHz.

An input impedance tuning network 110 having an input impedance Z1 is coupled between an input termination port P31 of the input quadrature coupler 98 and a fixed voltage node such as ground. An output impedance tuning network 112 having an output impedance Z2 is coupled between a second port P22 of the output quadrature coupler 100 and a fixed voltage node such as ground. The second port P22 is further coupled to the detector input 24.

The reconfigurable amplifier 10 further includes a bias controller 114 that includes a first artificial intelligence/machine learning module 116 having a detection signal input 118 coupled to the detector output 26 to receive the distortion detection signal generated by the distortion detector network 22. The first artificial intelligence/machine learning module 116 further includes a first plurality of external inputs 117 to receive environmental parameters that may include but are not limited to unwanted RF spectrum detection, power dissipation, antenna impedance, light, temperature, and process. In this exemplary embodiment, the distortion detection signal generated by the distortion detector network 22 is proportional to RF signal distortion of an amplified RF signal at the second port P22.

The bias controller 114 also includes a bias generator 120 that is controlled by the first artificial intelligence/machine learning module 116. The bias generator 120 has a first impedance tuning output 122 that is coupled to the input impedance tuning network 110. The bias generator 120 adjusts the impedance Z1 in response to a signal ΔZ1 generated by the first artificial intelligence/machine learning module 116 in response to the distortion detection signal and/or the pattern and relations identified by the first artificial intelligence/machine learning module 116.

The bias generator 120 has a first power amplifier bias output 124 that is coupled to the first power amplifier 102. The bias generator 120 adjusts the a first supply voltage $V_{DD1}$ in response to a signal $\Delta_{VDD1}$ and adjusts the a first gate voltage $V_{G1}$ in response to a signal $\Delta_{VG1}$, both of which are generated by the first artificial intelligence/machine learning module 116 in response to the distortion detection signal and/or the pattern and relations identified by the first artificial intelligence/machine learning module 116.

The bias generator 120 also has a second power amplifier bias output 126 that is coupled to the second power amplifier 104. The bias generator 120 adjusts the a second supply voltage $V_{DD2}$ in response to a signal $\Delta_{VDD2}$ and adjusts the a second gate voltage $V_{G2}$ in response to a signal $\Delta_{VG2}$, both of which are generated by the first artificial intelligence/machine learning module 116 in response to the distortion detection signal and/or the pattern and relations identified by the first artificial intelligence/machine learning module 116.

The bias generator 120 further includes a second impedance tuning output 128 that is coupled to the output impedance tuning network 112. The bias generator 120 adjusts the impedance Z2 in response to a signal ΔZ2 generated by the first artificial intelligence/machine learning module 116 in response to the distortion detection signal and/or the pattern and relations identified by the first artificial intelligence/machine learning module 116.

The reconfigurable amplifier 10 further includes an unwanted signal detector 130 for detecting out-of-band interferer signals. The unwanted signal detector 130 has an interferer signal input 132 coupled to the third port P31 of the input quadrature coupler 98 and an interferer detector output 134. The unwanted signal detector 130 is configured to generate an interferer detection signal that is proportional to unwanted signal level. To detect the unwanted signal, impedance at the third port P31 is necessarily not equal to impedance at the first port P11. In one embodiment the impedance Z1 may be momentarily adjusted by the bias generator 120 to ensure that impedance at port P31 is not equal to impedance at the first port P11.

The bias controller 114 further includes a second artificial intelligence/machine learning module 136 that has interferer detection input 138 that is coupled to the interferer detector output 134 to receive the interferer detection signal and environmental parameters through a second plurality of external inputs 137 to identify patterns and relations associated with the distortion detection signal and based upon the pattern and relations identified to more accurately and finely drive the bias generator 120 to generate bias signal levels that minimize distortion of the amplified RF signal at an RF signal output, which in this case is output load terminal 108. The bias generator 120 adjusts the impedance Z1 in response to a signal ΔZ1' generated by the second artificial intelligence/machine learning module 136 in response to the interferer detection signal and/or the pattern and relations identified by the second artificial intelligence/machine learning module 136. Similarly, the bias generator 120 adjusts the impedance Z2 in response to a signal ΔZ2' generated by the second artificial intelligence/machine learning module 136 in response to the interferer detection signal and/or the pattern and relations identified by the second artificial intelligence/machine learning module 136. The second artificial intelligence/machine learning module 136 is configured to adjust the impedance Z1 and the impedance Z2 to reduce the presence of detected interferer signals at the output load terminal 108.

The bias generator 120 also adjusts the first supply voltage $V_{DD1}$ in response to a signal $\Delta_{VDD1}'$ in response to the distortion detection signal and/or the pattern and relations identified by the second artificial intelligence/machine learning module 136. The bias generator 120 also adjusts the first gate voltage $V_{G1}$ in response to a signal $\Delta_{VG1'}$ in response to the distortion detection signal and/or the pattern and relations identified by the second artificial intelligence/machine learning module 136. Both the signal $\Delta_{VDD1}'$ and the signal $\Delta_{VG1'}$, are generated by the second artificial intelligence/machine learning module 136. The second artificial intelligence/machine learning module 136 is configured to adjust the first supply voltage $V_{DD1}$ and the first gate voltage $V_{G1}$ to reduce the presence of detected interferer signals at the output load terminal 108.

The bias generator 120 also adjusts the second supply voltage $V_{DD2}$ in response to a signal $\Delta_{VDD2'}$ in response to the distortion detection signal. The bias generator 120 also adjusts the second gate voltage $V_{G2}$ in response to a signal $\Delta_{VG2'}$ in response to the distortion detection signal and/or the pattern and relations identified by the second artificial intelligence/machine learning module 136. Both the signal $\Delta_{V_{DD2}}'$ and the signal $\Delta_{V_{G2}'}$ are generated by the second artificial intelligence/machine learning module 136. The second artificial intelligence/machine learning module 136 is configured to adjust the second supply voltage $V_{DD2}$ and the second gate voltage $V_{G2}$ to reduce the presence of detected interferer signals at the output load terminal 108.

Figure 8:
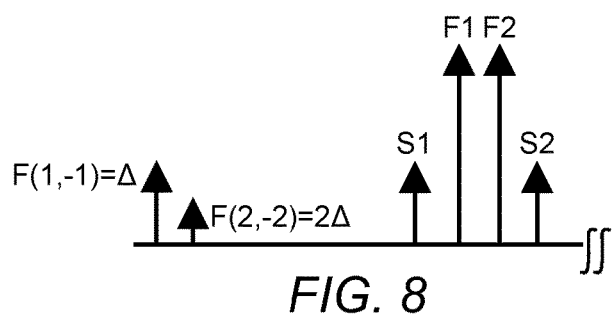
FIG. 8 is a spectrum diagram of two signals applied to the input terminal of the reconfigurable amplifier of FIG. 7.
Figure 9:
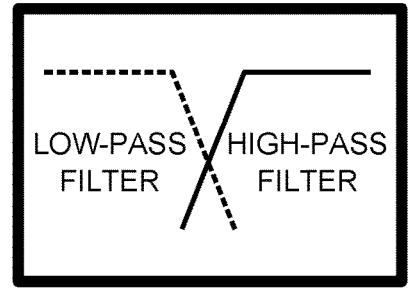
FIG. 9 is a symbolic graphic that illustrates that the base distortion signal experiences low-pass filtering and the higher frequency RF signal experiences high-pass filtering as the signals pass through the reconfigurable amplifier of FIG. 7.
Figure 10:
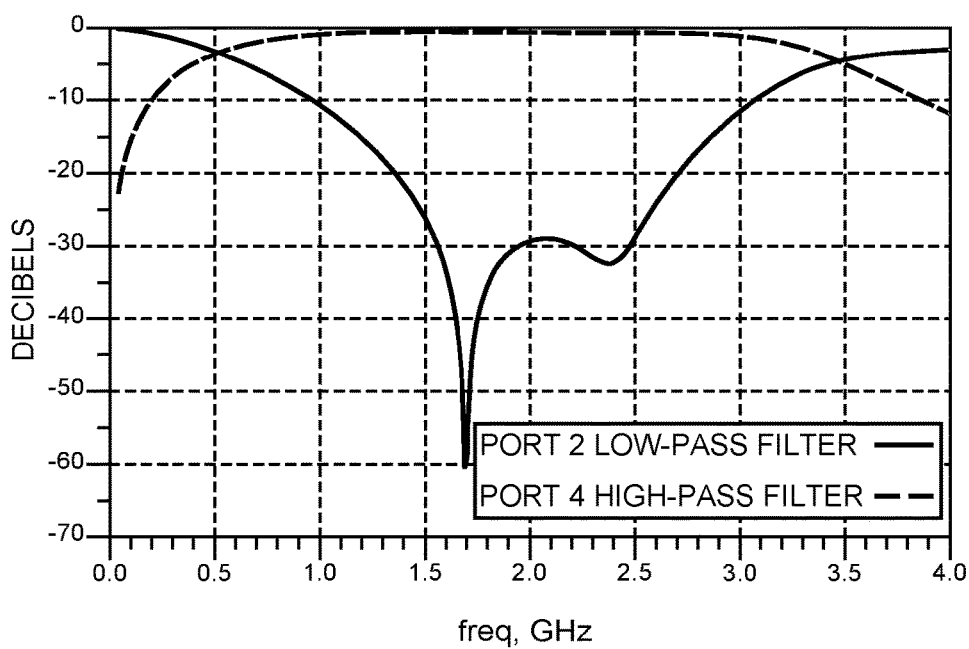
FIG. 10 is a graph depicting frequency responses of a second port and fourth port of an output quadrature coupler comprising the reconfigurable amplifier of FIG. 7.

FIG. 8 is a spectrum diagram of two-tone test signals applied to the input terminal 106 of the reconfigurable amplifier 10. FIG. 9 is a symbolic graphic that illustrates that the RF signal spectrum experiences low-pass filtering passing the baseband beat distortion byproducts and the RF signal spectrum also experiences high-pass filtering passing the desired RF spectrum as the signals pass through the reconfigurable amplifier 10. FIG. 10 is a graph depicting frequency responses of the low-pass filter second port P22 response and the high-pass filter (bandpass filter) fourth port P42 response of the output quadrature coupler 100 (FIG. 7).

Figure 11:
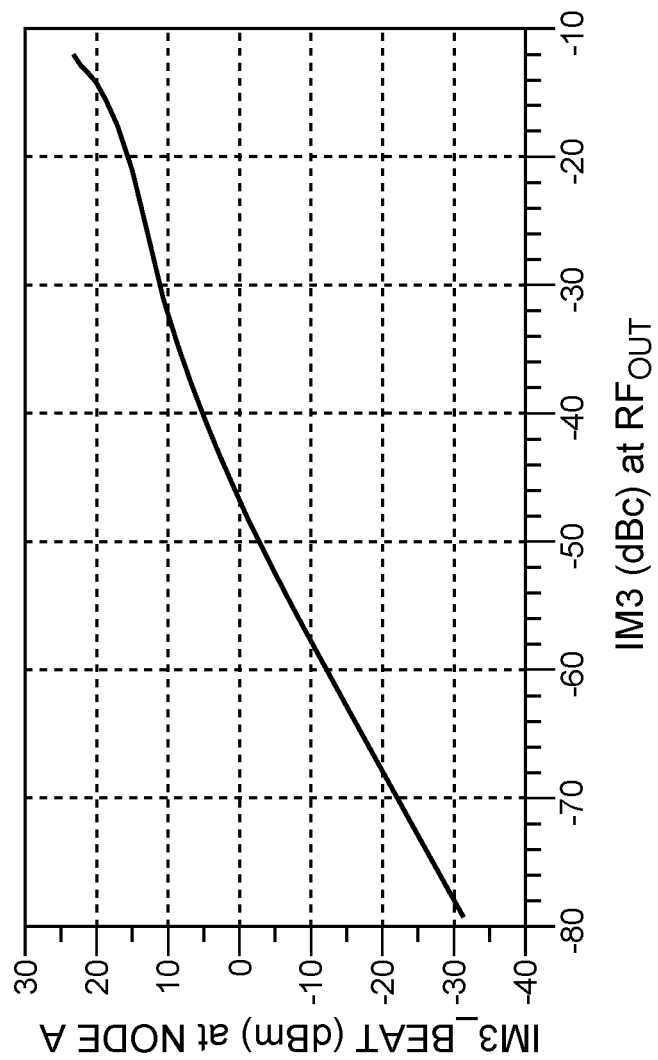
FIG. 11 is a graph illustrating that baseband intermodulation (IM) byproduct is approximately linearly correlated to third order intermodulation (IM3).
Figure 12:
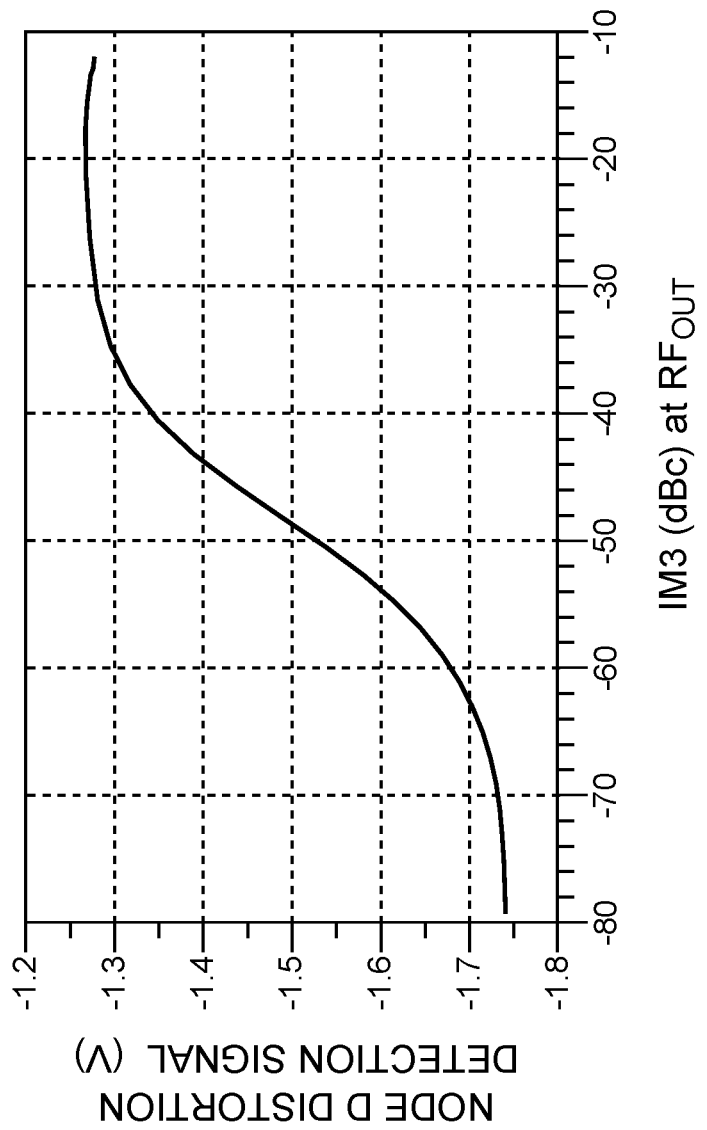
FIG. 12 is a graph illustrating that the distortion detection signal is monotonically related to RF IM3 distortion at the RF output.
Figure 13:
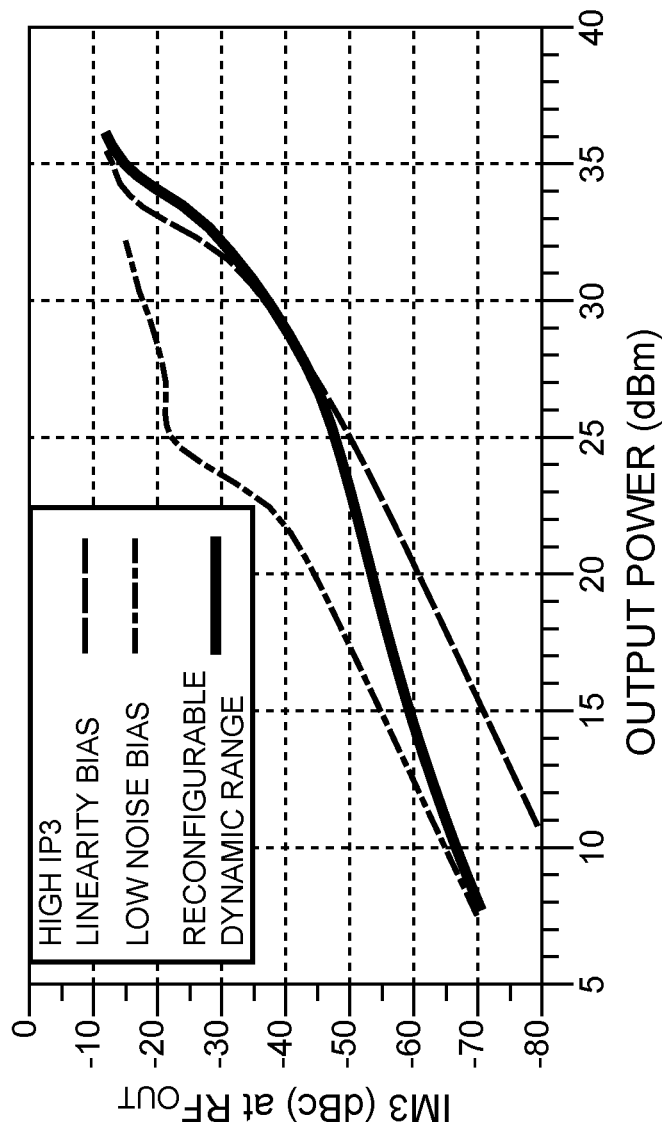
FIG. 13 is a graph illustrating that reconfigurable dynamic range provided by the reconfigurable amplifier of FIG. 7 improves IM3 at relatively high power ranges.

FIG. 11 is a graph illustrating that baseband intermodulation byproduct (IM3_Beat) at node A (FIG. 2) is linearly correlated to third order intermodulation (IM3) measured at the RF signal output 16 (FIG. 1). FIG. 12 is a graph illustrating that the (baseband intermodulation byproduct) distortion detection signal is monotonically related to the RF intermodulation distortion suppression, IM3 in dBc. FIG. 13 is a graph illustrating that reconfigurable dynamic range provided by the reconfigurable amplifier 10 improves RF IM3 distortion at relatively high power ranges.

Figure 14:
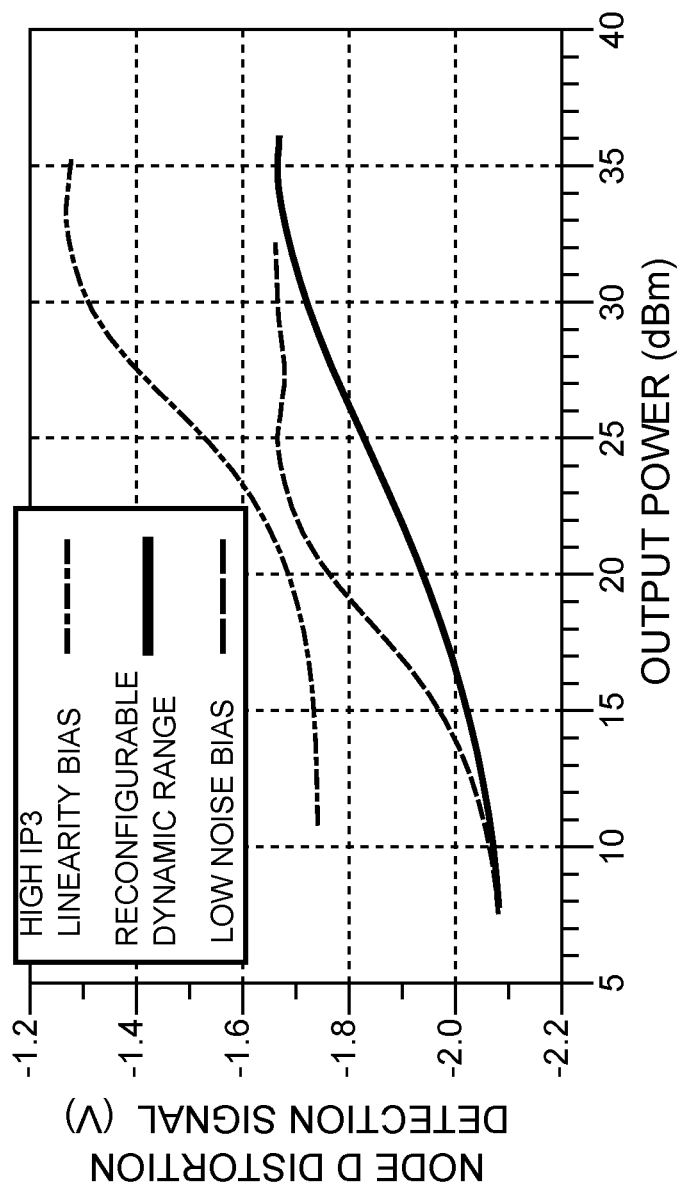
FIG. 14 is a graph that illustrates that the distortion detection signal tracks IM3.
Figure 15:
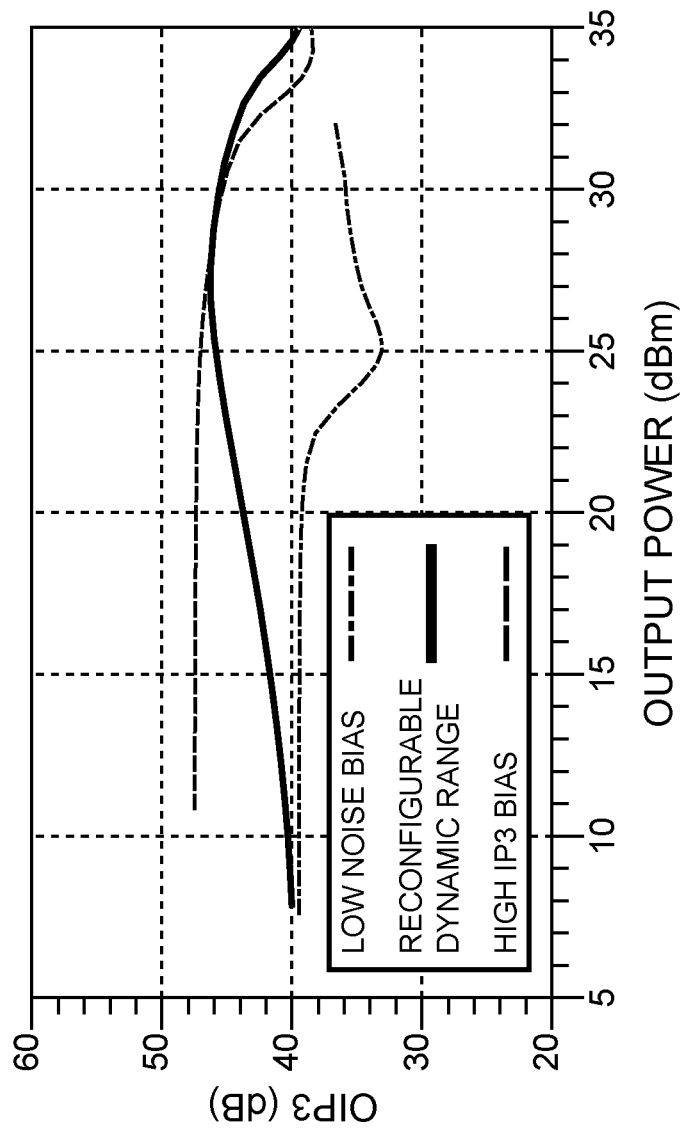
FIG. 15 is a graph of third-order intercept IP3 (OIP3) versus output power for the reconfigurable amplifier of FIG. 7.
Figure 16:
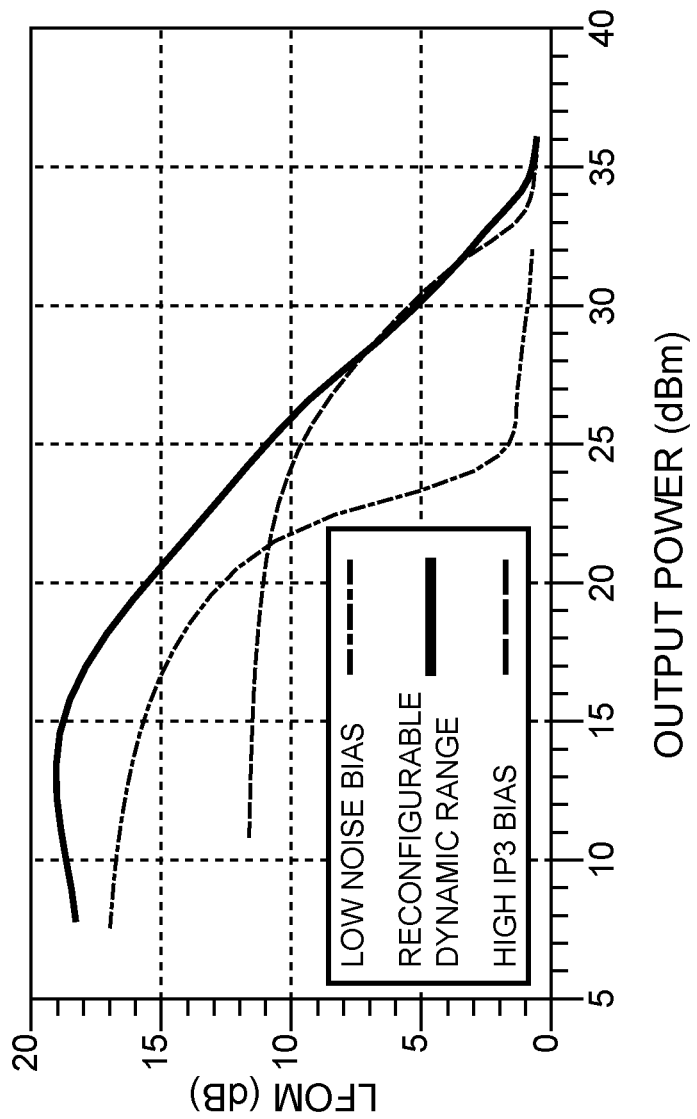
FIG. 16 is a graph of linearity-figure-of-merit (LFOM=IP3/Pdc) versus output power for the reconfigurable amplifier of FIG. 7.
Figure 17:
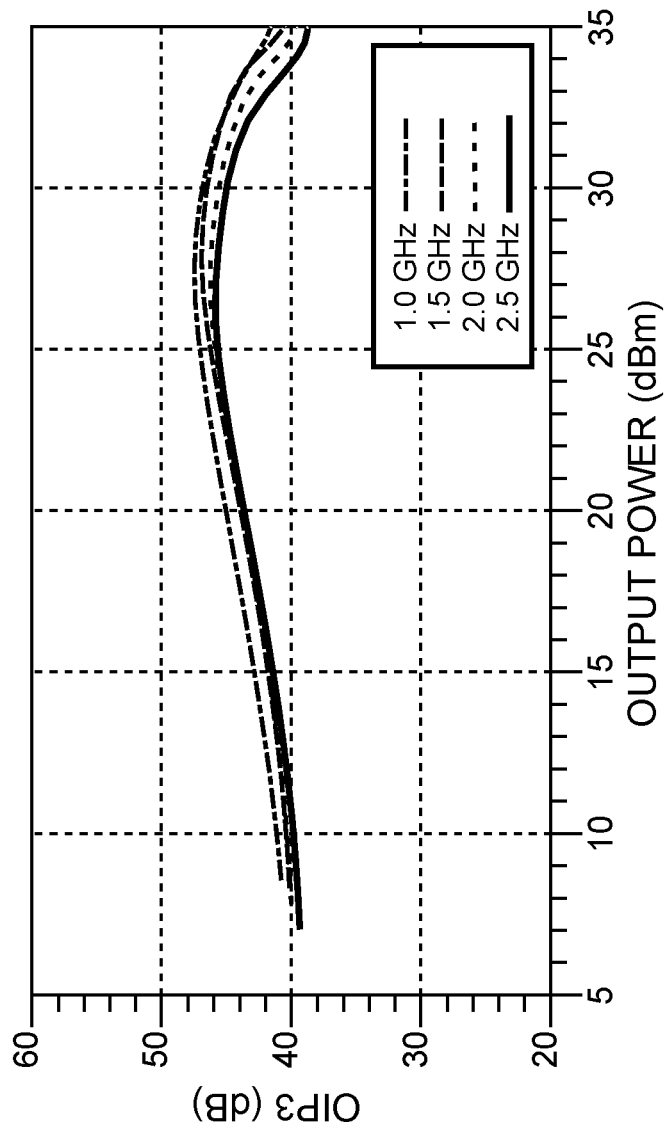
FIG. 17 is a graph of OIP3 versus output power illustrating consistent performance across at least an octave of bandwidth from 1 GHz to 2.5 GHz.

FIG. 14 is a graph that illustrates that the distortion detection signal tracks the RF IM3 distortion. FIG. 15 is a graph of third-order intercept IP3 (OIP3) versus output power for the reconfigurable amplifier 10 illustrating the improvement of the reconfigurable dynamic range circuitry in linearity at the highest power levels above 30 dBm output as compared to the high IP3 bias. FIG. 16 is a graph of linearity-figure-of-merit (LFOM) which is a measure of linear efficiency versus output power for the reconfigurable amplifier 10 illustrating the optimization of LFOM across a wide dynamic range for the reconfigurable dynamic range case. FIG. 17 is a graph of OIP3 versus output illustrating consistent performance across at least an octave of bandwidth encompassing 1 GHz to 2.5 GHz.

Figure 18:
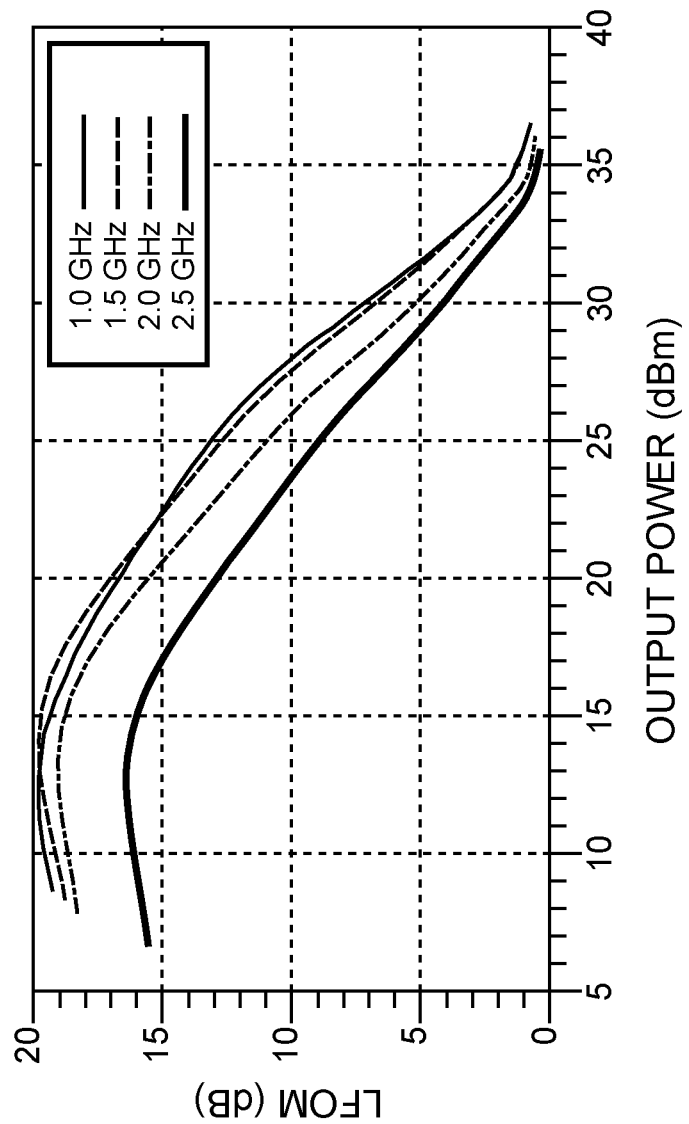
FIG. 18 is a graph of LFOM versus output power illustrating consistent performance across at least an octave of bandwidth from 1 GHz to 2.5 GHz.
Figure 19:
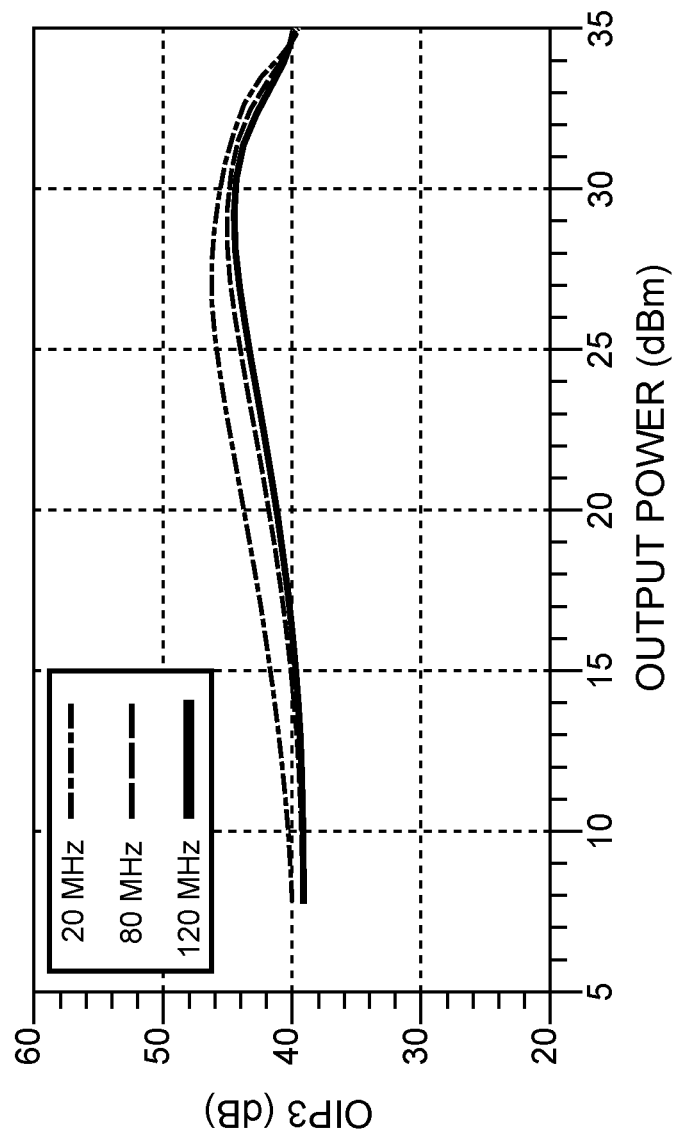
FIG. 19 is a graph of OIP3 versus output illustrating that look-up tables and or artificial intelligence maintain consistency of performance across a beat tone.
Figure 20:
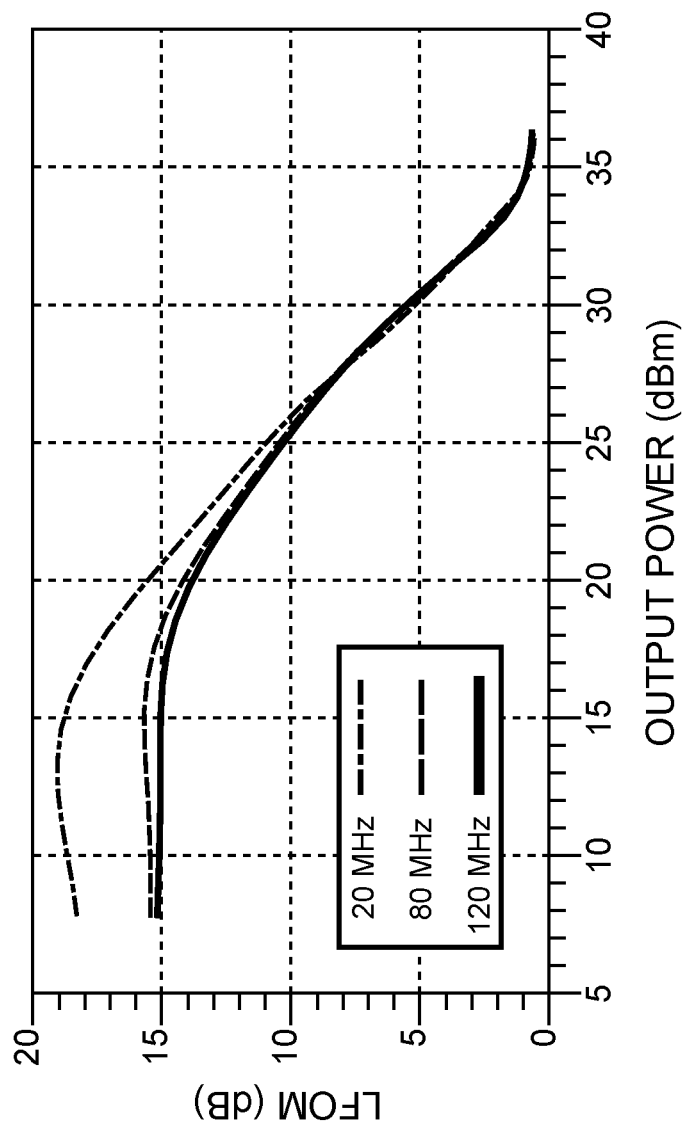
FIG. 20 is a graph of LFOM versus output power illustrating that look-up tables and/or artificial intelligence maintains LFOM (linear efficiency) performance across a beat tone.

FIG. 18 is a graph of LFOM versus output power illustrating consistent performance across at least an octave of bandwidth encompassing 1 GHz to 2.5 GHz. FIG. 19 is a graph of OIP3 versus output illustrating that look-up tables and/or artificial intelligence increase consistency of performance across a beat tone. FIG. 20 is a graph of LFOM versus output power illustrating that look-up tables and/or artificial intelligence increase consistency of performance across a beat tone.

Those skilled in the art will recognize improvements and modifications to the preferred embodiments of the present disclosure. All such improvements and modifications are considered within the scope of the concepts disclosed herein and the claims that follow.

What is claimed is:
1. A reconfigurable amplifier comprising:
  an amplifier having a radio frequency (RF) signal input, an RF signal output, and a bias signal input;
  a distortion detector network having a detector input coupled to the RF signal output and a detector output, wherein the distortion detector network is configured to generate a distortion detection signal that is proportional to distortion at the RF signal output; and
  a bias controller comprising a bias generator configured to generate a bias signal to set bias points for the amplifier, the bias controller having a detection signal input coupled to the detector output and a bias output coupled to the bias signal input, wherein the bias controller is configured to drive the bias generator to generate a bias signal that dynamically shifts level at the bias output to reduce the distortion at the RF signal output.

2. The reconfigurable amplifier of claim 1 wherein the distortion is baseband intermodulation distortion.

3. The reconfigurable amplifier of claim 1 wherein the distortion detection signal is baseband distortion of an RF intermodulation signal at the RF signal output.

4. The reconfigurable amplifier of claim 1 wherein the amplifier is a low-noise amplifier.

5. The reconfigurable amplifier of claim 4 wherein the low-noise amplifier comprises a low-noise high electron mobility transistor (HEMT).

6. The reconfigurable amplifier of claim 5 wherein the low-noise HEMT is a III-V semiconductor device.

7. The reconfigurable amplifier of claim 6 wherein the III-V semiconductor device is a gallium nitride transistor.

8. The reconfigurable amplifier of claim 1 wherein the amplifier is an RF power amplifier comprising a power transistor.

9. The reconfigurable amplifier of claim 8 wherein the power transistor is a gallium nitride transistor.

10. The reconfigurable amplifier of claim 1 wherein the amplifier is a single-ended amplifier.

11. The reconfigurable amplifier of claim 1 further comprising an input impedance tuning network having input impedance that is tunable and wherein the bias controller is further configured to tune the input impedance in response to the distortion detection signal.

12. The reconfigurable amplifier of claim 1 further comprising an output impedance tuning network having output impedance that is tunable and wherein the bias controller is further configured to tune the output impedance in response to the distortion detection signal.

13. The reconfigurable amplifier of claim 1 wherein the bias controller comprises a first artificial intelligence/machine learning module that is configured to receive the distortion detection signal and identify patterns associated with the distortion detection signal and based upon the patterns identified to drive the bias generator to generate bias signal levels that minimize RF signal distortion of an amplified RF signal at the RF signal output.

14. The reconfigurable amplifier of claim 13 comprising an unwanted signal detector coupled to an input port of the amplifier, wherein the unwanted signal detector is configured to detect out-of-band signals and generate an interferer detection signal.

15. The reconfigurable amplifier of claim 14 wherein the bias controller comprises a second artificial intelligence/machine learning module that is configured to receive the interferer detection signal and identify patterns associated with the interferer detection signal and based upon the patterns identified to drive the bias generator to generate bias signal levels that minimize RF signal distortion of the amplified RF signal at the RF signal output.

16. The reconfigurable amplifier of claim 14 further comprising an input impedance tuning network having input impedance that is tunable and wherein the bias controller is further configured to tune the input impedance in response to the interferer detection signal.

17. The reconfigurable amplifier of claim 14 further comprising an output impedance tuning network having output impedance that is tunable and wherein the bias controller is further configured to tune the output impedance in response to the interferer detection signal.

18. The reconfigurable amplifier of claim 1 wherein the distortion detector network is configured to detect down-converted baseband odd order distortion.

19. The reconfigurable amplifier of claim 1 wherein the distortion detector network is configured to detect down-converted baseband even order distortion.

20. The reconfigurable amplifier of claim 1 wherein the distortion detector network comprises a low-pass amplifier coupled to the RF signal output and rectifier circuitry coupled between the low-pass amplifier and the detector output.

21. The reconfigurable amplifier of claim 20 wherein the distortion detector network further comprises a level shifter coupled between the rectifier circuitry and the detector output.

* * * * *